US005502314A

United States Patent [19]

Hori

[11] Patent Number: 5,502,314

[45] Date of Patent: Mar. 26, 1996

[54] FIELD-EMISSION ELEMENT HAVING A CATHODE WITH A SMALL RADIUS

[75] Inventor: Yoshikazu Hori, Kobe, Japan

[73] Assignee: Matsushita Electric Industrial Co., Ltd., Osaka, Japan

[21] Appl. No.: 269,676

[22] Filed: Jul. 1, 1994

[30] Foreign Application Priority Data

Jul. 5, 1993 [JP] Japan .................................... 5-165310
Apr. 28, 1994 [JP] Japan .................................... 6-091398

[51] Int. Cl.$^{6}$ ........................... H01L 29/06; H01L 29/12; H01L 29/04; H01J 1/46

[52] U.S. Cl. ............................... 257/10; 257/11; 257/623; 257/628; 313/308; 313/309; 313/351

[58] Field of Search ............................... 257/10, 11, 623, 257/628; 313/308, 309, 329, 334, 335, 338, 351

[56] References Cited

U.S. PATENT DOCUMENTS

| | | | |
|---|---|---|---|
| 5,148,078 | 9/1992 | Kane | 313/307 |
| 5,148,079 | 9/1992 | Kado et al. | 313/309 |
| 5,214,346 | 5/1993 | Komatsu | 313/351 |
| 5,245,247 | 9/1993 | Hosogi | 313/308 |
| 5,289,077 | 2/1994 | Ugajin | 313/308 |
| 5,289,086 | 2/1994 | Kane | 313/308 |
| 5,386,172 | 1/1995 | Komatsu | 313/351 |

FOREIGN PATENT DOCUMENTS

| | | |
|---|---|---|
| 0443865 | 8/1991 | European Pat. Off. . |
| 2657999 | 1/1991 | France . |
| 2662301 | 5/1991 | France . |
| 4224519 | 1/1994 | Germany . |

OTHER PUBLICATIONS

Junji Itoh et al., Japanese Journal of Applied Physics, No. 3A, Part 1, pp. 1221–1226 (Mar. 1993).

H. Gray, Almquist & Wiksell International, Stockholm, Sweden, "Silicon Field Emitter Array Technology", pp. 111–117 (1982).

C. Spindt et al., "Field Emission Cathode Array Development for High Current Density Applications", p. 119.

C. Spindt et al., Journal of Applied Physics, vol. 47, No. 12, pp. 5248–5263 (1976).

*Primary Examiner*—Mahshid Saadat
*Attorney, Agent, or Firm*—Willian Brinks Hofer Gilson & Lione

[57] ABSTRACT

The invention is a field-emission element that is fabricated by forming an elevated surface and a base surface on a conductive substrate or a semiconductor substrate by applying a photolithographic process and an etching process, and making these surfaces cross at a step with an acute angle between the two surfaces. The intersection of the elevated surface with the step form a cathode having a radius of curvature of less than 20 nm. A gate electrode formed on the base electrode but insulated therefrom is disposed at a distance less than 1 μm from said cathode by controlling the distance by the thickness of an etching protection mask. The field-emission element enables electrons to be emitted from the cathode when a voltage less than 150V is applied between the cathode and the gate electrode.

16 Claims, 11 Drawing Sheets

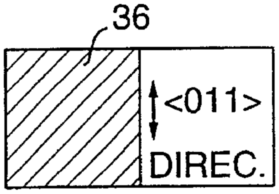
FIG. 10(a)
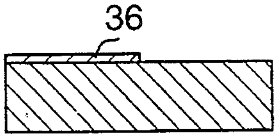
FIG. 10(a')
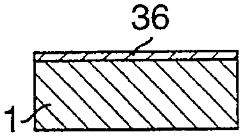
FIG. 10(a")
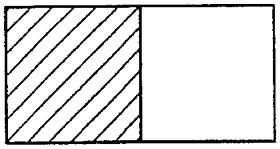
FIG. 10(b)
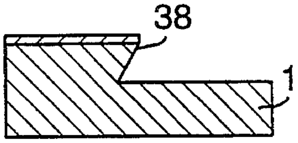
FIG. 10(b')
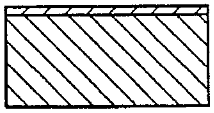
FIG. 10(b")
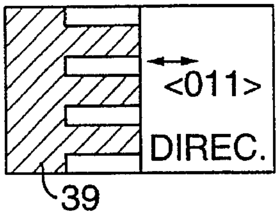
FIG. 10(c)
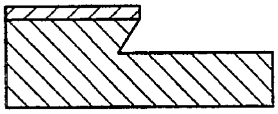
FIG. 10(c')
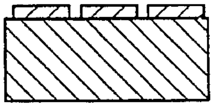
FIG. 10(c")
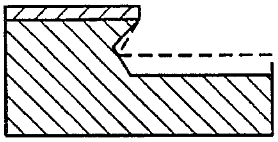
FIG. 10(d')
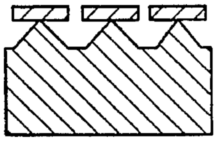
FIG. 10(d")
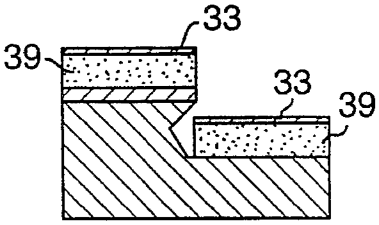
FIG. 10(e')
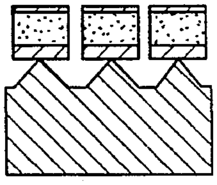
FIG. 10(e")
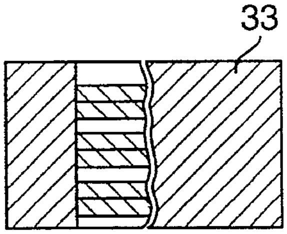
FIG. 10(f)
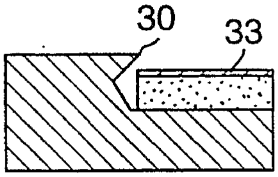
FIG. 10(f')
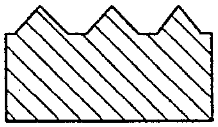
FIG. 10(f")

FIELD-EMISSION ELEMENT HAVING A CATHODE WITH A SMALL RADIUS

BACKGROUND OF THE INVENTION

The present invention relates to integrated field-emission elements operable at a low voltage and to methods of forming such elements.

The fabrication of miniaturized field-emission elements became possible by the advancements of semiconductor fabrication technologies. In particular, Spindt et al. disclosed the fabrication of a corn-shaped (vertical) field-emission cathode. (C. A. Spindt, J. Appl. Phys, Vol. 47, p. 5248 (1976).

Turning now to the drawings, FIG. 12(*a*)–FIG. 12(*d*) depict the conventional fabrication method of a field-emission cathode disclosed by Spindt et al. The Spindt et al. process is explained below.

As depicted in FIG. 12(*a*), the fabrication process is begun with depositions of an insulation layer 101 and a metal layer 102 utilized as a gate electrode on a semiconductor (silicon) substrate 100. A round small hole 103 is then formed in said metal layer 102 and insulation layer 101 by using a conventional photolithographic process.

As depicted in FIG. 12(*b*), a sacrificing layer 104, made of a material such as alumina, is vacuum deposited on the semiconductor substrate 100 at a shallow angle thereto and the gate electrode. As a result, the diameter of gate hole 103 is substantially reduced. Then, as shown in FIG. 12(*c*), metal layer 105, made of a material such as molybdenum, is vertically deposited on semiconductor substrate 100. The gate-hole diameter is gradually reduced as the metal layer 105 is vacuum deposited, and a cone-shaped emitter (cathode) 106 is formed within gate hole 13.

The fabrication process is completed by removing the sacrificing layer 104 and the unnecessary metal layer 105. The field-emission cathode, thus obtained, is operable by applying a high-voltage on gate electrode 102. This causes electrons to be drawn into a vacuum from emitter 106. The electrons are collected by an anode (not shown) disposed at a position opposing emitter 106.

Following the fabrication process disclosed by Spindt et al., a vertical type field-emission cathode of similar construction, having a sharper emitter formed by applying either an anisotropic etching or a thermal oxidation process on a silicon crystal surface was disclosed. (H. F. Gray et al., IEDM Tech. Dig. P. 776 (1986), and Betsui, Trans. 1990 Fall. Conv. of Elect. Inform. Comm. Engineer. Japan, No. 5, SC-8-2 (1990)).

In contrast to the fabrication of vertical structure cathodes described above, Itoh et al. disclose a field-emission cathode of planar construction (Itoh et al., Vacuum. Vol. 34, P. 867 (1991)). As depicted in FIG. 13(*a*), the planar field-emission cathode is shown as a comb-shaped emitter 108 made of an etched-off metal layer disposed on quartz substrate 107, gate 109, and anode (not shown) deposited on the same substrate. The planar cathode disclosed by Itoh et al. has small capacitances, and is highly advantageous for use in various ultra high-speed electron devices. This is particularly true for the devices employing a silicon substrate instead of the quartz substrate, since it can be integrated with Large Scale Integration (LSI) devices. The method of fabricating planar field-emission cathodes is explained below in connection with FIG. 13(*b*)FIG.13(*h*).

Turning now to FIG. 13(*b*), a cathode metal layer 108 made of tungsten (W) is deposited first on quartz substrate

107. Then, as shown in FIG. 13(*c*), the outline of emitter layer 108 is drawn by RIE (reactive ion etching) using a photoresist layer 109 as a mask. Then, the quarter substrate 107 is etched off into a form shown in FIG. 13(*d*) by using fluoric acid. After vacuum depositing a gate metal 110 thereon, as shown in FIG. 13(*e*), a wet-etching is applied thereon to form gate electrode 110, and the photoresist layer 109, deposited on emitter 108, is removed.

Then, as shown in FIG. 13(*f*), gate electrode 110 is formed by employing serial photolithographic and wet-etching processes in which a photoresist layer 111 is deposited thereon and is used as a mask. As shown in FIG. 13(*g*) and FIG. 13(*h*), a comb-shaped emitter 112 is formed by applying serial photolithographic and wet-etching processes utilizing photoresist layer 113 as a mask.

However, there are problems associated with the conventional cone-shaped field-emission cathodes, and the process used to fabricate such cone-shaped cathodes. In particular, the minimum radius of curvature of the emitter and the emitter-to-gate distance are about 20 nm and 0.5 μm, respectively. Also, an electron-beam exposure method has to be employed to ensure the uniformity of the curvatures of the emitter.

As for the comb-shaped (emitter) cathodes described above, such cathodes can be fabricated using a conventional photolithographic process. Also, the emitter-to-gate electrode distance is easily controllable to a submicron order, and the reproducibility and device uniformity are advantageously high. However, there are problems associated with the comb-shaped field-emission cathodes also. In particular, the minimum radius of curvature of the emitter available by the process disclosed by Itoh et al. is as large as 40 nm, and the operating field requires a relatively high voltage or electric field of 150V.

None of the prior art has the advantages of providing a field emission element with a minimum radius of curvature and minimum emitter-to-gate distances, operable at less than 150 volts, and fabricated by a process that results in high reproducibility, device uniformity and excellent characteristics.

SUMMARY OF THE INVENTION

According to the invention, a field-emission element is provided that is operable at low voltage wherein an elevated surface is provided on a conductive substrate or a semiconductor substrate, with a step crossing with said elevated surface at an acute angle, and a cathode having a small radius of curvature formed by an intersection between a surface of said step and said elevated surface, with a base surface intersecting with a lower edge of said step, and a gate electrode insulated from said base surface and disposed at a position close to said cathode, wherein electrons are emitted from said cathode when a low electric voltage is applied between said gate electrode and said cathode.

The field-emission element is fabricated using a process to form an etching protection mask on the substrate, a photolithographic process to form a boundary on the etching protection mask, a cathode forming process to form the step making an acute angle with the elevated surface on the substrate by applying an etching from an oblique direction along the boundary formed on the etching protection mask, a process to form an insulation layer on the substrate by using the etching protection mask and a gate electrode on the insulation layer, and a process to remove the etching protection mask, the insulation layer and the gate electrode formed on the elevated surface by applying a lift-off method.

The hereinafter described field-emission element has the advantages of having a minimum radius of curvature, a minimum emitter to gate distance, and operable at less than 150 volts. The fabrication process described hereinafter has the advantages of being able to reproduce the element with uniform and excellent characteristics.

BRIEF DESCRIPTION OF THE DRAWINGS

FIGS. 10(*a*), 10(*b*), 10(*c*) and 10(*f*) are top views, FIGS. 10(*a'*), 10(*b'*), 10(*c'*), 10(*d'*), 10(*e'*) and 10(*f'*) are cross-sectional views, and FIGS. 10(*a"*), 10(*b"*), 10(*c"*), 10(*d"*), 10(*e"*), and 10(*f"*) are end views of (field-emission element according to the fourth embodiment of the invention, depicting its fabrication processes.

DETAILED DESCRIPTION

Figure 1:
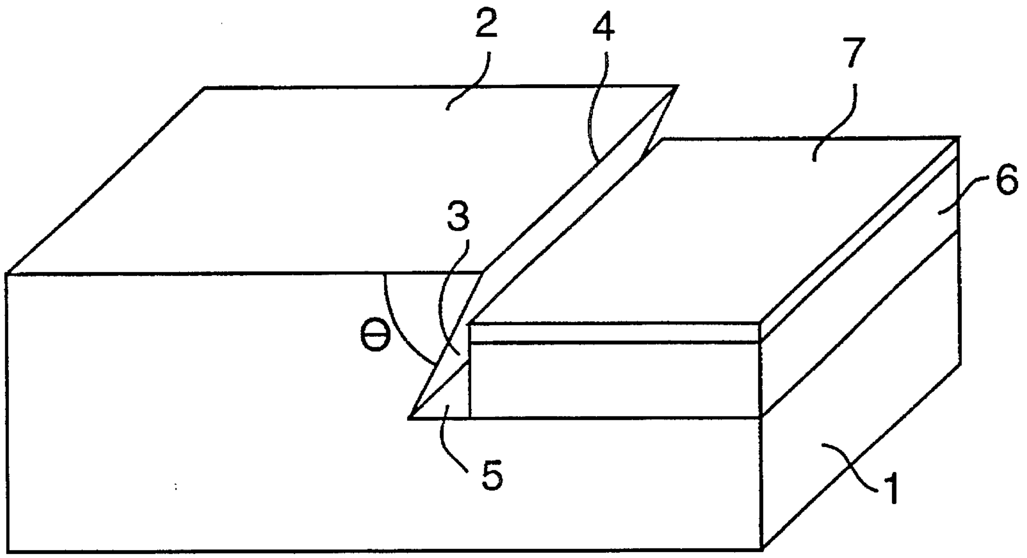
FIG. 1 is a perspective cross-sectional view of a field-emission element-according to the first embodiment of the invention.
Figure 2A:
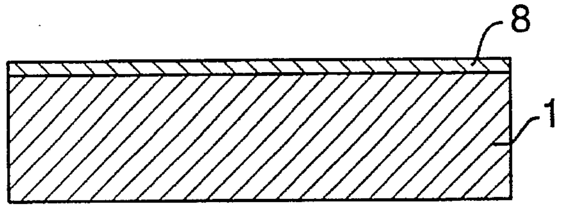
FIGS. 2(*a*), 2(*b*), 2(*c*), 2(*d*) and 2(*e*) are sectional views showing the steps in fabricating a field-emission element according to the first embodiment of the invention, applying a dry-etching process.
Figure 2B:
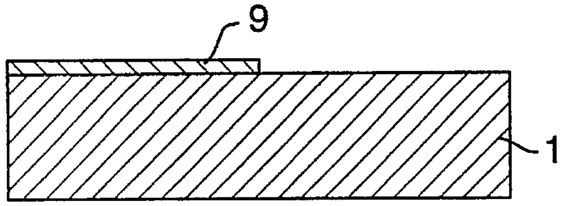
Figure 2C:
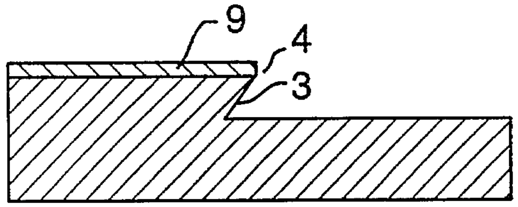
Figure 2D:
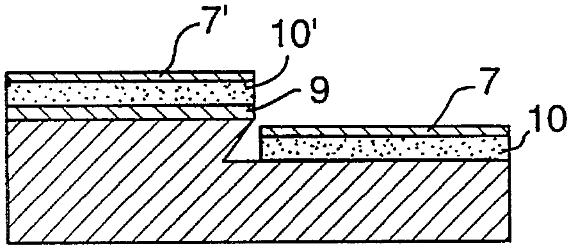
Figure 2E:
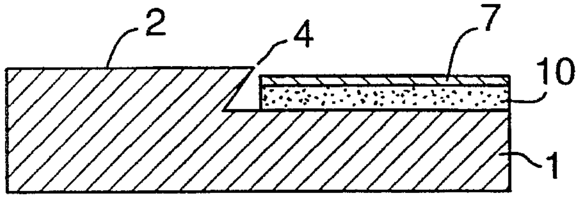
Figure 3A:
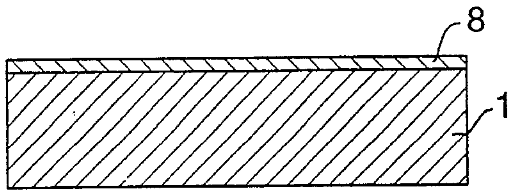
FIGS. 3(*a*), 3(*b*), 3(*c*), 3(*d*), 3(*e*) and 3(*f*) are sectional views of a field-emission element according to the first embodiment of the invention, applying a wet anisotropic-etching process resulting in a non-planar gate electrode.
Figure 3B:
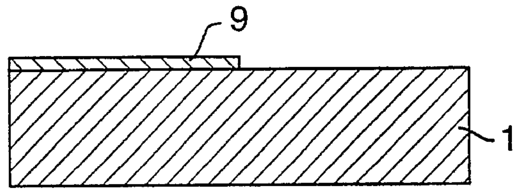
Figure 3C:
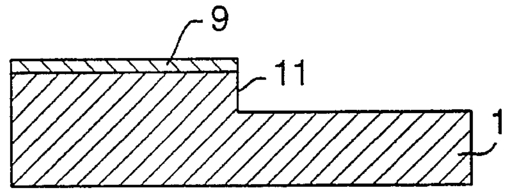
Figure 3D:
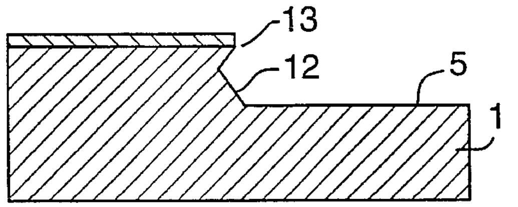
Figure 3E:
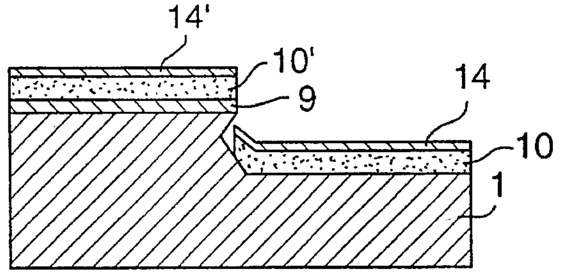
Figure 3F:
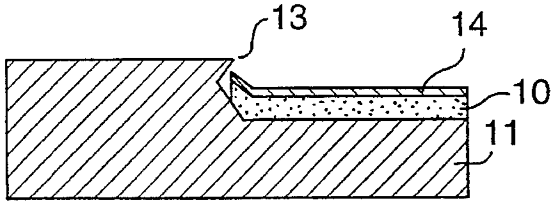
Figure 4A:
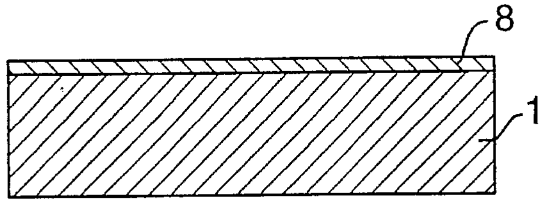
FIGS. 4(*a*), 4(*b*), 4(*c*), 4(*d*), 4(*e*) and 4(*f*) are sectional views of a field- emission element according to the first embodiment of the invention, applying a wet anisotropic-etching process resulting in a planar gate electrode.
Figure 4B:
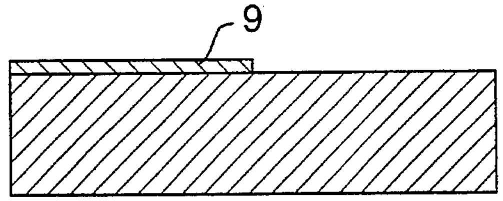
Figure 4C:
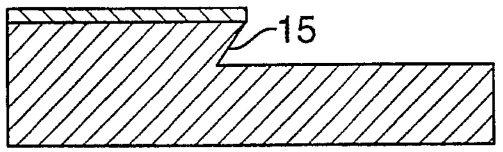
Figure 4D:
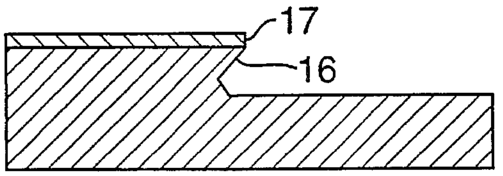
Figure 4E:
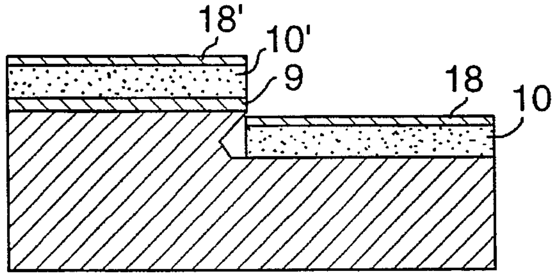
Figure 4F:
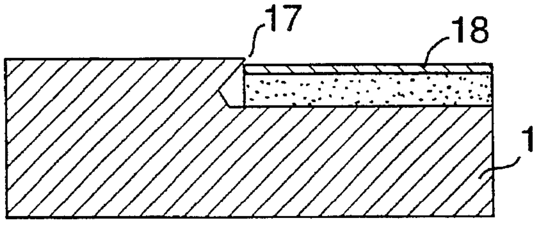

At the outset, it is pointed out that in the drawings, like numerals are used to designate like parts throughout. In addition, it is to be noted that the following description and the claims use "( )" to describe a crystal plane and "< >" to describe a crystal direction. Such usages are well known in crystallography.

First Embodiment

Turning now to the drawings, FIG. 1 shows a perspective cross-sectional view of a field-emission element according to the first embodiment of the present invention. In FIG. 1, a semiconductor substrate 1 consisting of a silicon single crystal in which a step 3, intersecting with elevated surface 2 at an acute angle of θ, is formed. The intersection line 4, formed between step 3 and the elevated surface 2, acts as a linear cathode in this embodiment. The radius of curvature of the linear cathode 4 is about 10 nm, which is smaller than the radius of curvature of the cone or comb-shaped cathodes described above. The lower edge of step 3 intersects with base surface 5. Adjacent the step 3, a gate electrode 7, insulated from base surface 5 by insulation layer 6, is formed on the base surface 5 at a position close to the cathode 4.

The distance between elevated surface 2 and gate electrode 7 is 100 nm, and the width of the linear cathode 4 is about 1 mm.

The field-emission element, just described, has the significant advantages of being operable with a voltage of about 50 volts between the elevated surface 2 and the gate electrode 7, with electrons being emitted at a current magnitude of about 10 μA from the linear cathode 4.

FIGS. 2(*a*), 2(*b*), 2(*c*) and 2(*e*) are sectional views showing the steps in fabricating a field-emission element according to the first embodiment of the invention, applying a dry-etching process.

As shown in FIG. 2(*a*), silicon oxide layer 8 is formed first on silicon single crystal substrate 1. As shown in FIG. 2(*b*), an etching protection mask 9, having a linear boundary, is then photolithographically formed on the silicon single crystal substrate 1.

Next, as shown in FIG. 2(*c*), dry-etching is performed on the silicon substrate 1 to remove a portion of the substrate 1 including a portion below the mask 9 in a direction slanted from the vertical line to silicon single crystal substrate 1 to form step 3. Step 3 forms an acute angle with the boundary line of the etching-protection mask 9. The boundary line or the line intersecting the elevated surface and step 3 acts as a line cathode 4 in this embodiment.

As shown in FIG. 2(*d*), next, insulation layer 10 and 10' and gate electrodes 7 and 7' are vertically deposited on the silicon single crystal substrate 1 in order to cover the entire surface of silicon single crystal substrate 1. At this time, etching protection mask 9 is utilized as a deposition mask. At the same time, gate electrode 7 is disposed at a position close to the cathode without requiring an extra trimming process. The cathode-to-gate electrode distance is determined by controlling the thickness of insulation layer 10.

Next, as shown in FIG. 2(*e*), etching protection mask 9, insulation layer 10', and gate electrode 7' formed on the elevated surface, are removed by a lift-off method using an aqueous solution of fluoric acid.

Because of the field effect produced by the voltage applied between gate electrode 7 and cathode 4, electrons are emitted from cathode 4 into a direction vertical to the step and nearly parallel to the surface of silicon single crystal substrate 1.

Although a step 3 intersecting with an elevated surface 2 at an acute angle θ is formed by applying a dry-etching process in the above embodiment as shown in FIGS. 2(*a*)–2(*e*), a gate electrode can also be formed at the boundary of etching protection mask 9, without requiring an extra trimming process, by applying a wet-etching process under a side-etch producing condition.

Moreover, a cathode (emitter), with an extremely small radius, can also be formed by applying a wet anisotropic-etching process instead of an obliquely applied dry-etching process. With a wet anisotropic-etching process, a field-emission element, having excellent characteristics and good reproducibility, can be fabricated since the cathode is determined by the crystal orientation of the substrate. The fabrication steps, using a wet anisotropic-etching process, are explained next with reference to FIGS. 3(*a*) to 3(*f*).

Turning now to FIG. 3(*a*), a silicon oxide layer 8 is formed first on the (100) plane of silicon single crystal substrate 1. Then, as shown in FIG. 3(*b*), an etching protection mask 9, with a boundary line formed along the <011> direction, is deposited on the surface of silicon single crystal substrate 1, by using a photolithographic method. As shown in FIG. 3(*c*) next, a step 11, vertical to the boundary of etching protection mask 9, is formed by applying a dry-etching from a direction vertical to the surface of silicon single crystal substrate 1.

Then, as shown in FIG. 3(*d*), a V-shaped step 12 is formed on a side surface of step 11, by applying a wet anisotropic-etching process, using an aqueous solution of potassium hydroxide on the side surface of step 11 and base surface 5. Step 12 is inwardly etched off at the boundary of etching protection mask 9, forming an acute angle thereby, and forming cathode 13.

Then, as shown in FIG. 3(*e*), insulation layer 10 and 10' and gate electrodes 14 and 14' are successively deposited on the nearly entire surface of silicon single crystal substrate 1. At this time, etching protection mask 9 acts as a deposition mask. At the same time, gate electrode 14 is formed on the base surface at a position close to cathode 13 requiring no extra trimming process.

Then as shown in FIG. 3(*f*), etching protection mask 9, insulation layer 10' and gate electrode 14' formed on the elevated surface, are removed altogether by applying a lift-off process to etching protection mask 9 thereby, exposing cathode 13.

Although the surface of gate electrode 14 is not planar in the neighborhood of cathode 13 with the presently shown fabrication method, fabrication of a planar gate electrode is possible also. The fabrication method for fabricating a planar gate electrode for use with a V-shaped step is explained next referring to FIGS. 4(*a*) to 4(*f*).

As shown in FIG. 4(*a*), the fabrication method is started with a deposition of silicon oxide layer 8 on the (100) surface of silicon single crystal substrate 1. This is followed by, as shown in FIG. 4(*b*), the photolithographic deposition of etching protection mask 9 having a boundary line along the <011> direction on the surface of silicon single crystal substrate 1.

Then, as shown in FIG. 4(*c*), a step 15 intersecting with an elevated surface at an acute angle is formed at the boundary of etching protection mask 9 by applying a dry-etching process, from an oblique direction to the vertical direction, to the surface of silicon single crystal substrate 1. (This part of the process differs from that shown in FIG. 3(*c*) where the dry-etching process is applied from a direction vertical to the surface of the substrate 11.)

Then, as shown in FIG. 4(*d*), a V-shaped step 16 is formed by applying a wet anisotropic-etching process, using an aqueous solution of potassium hydroxide to expose the (111) plane of step 15. Step 15 is inwardly etched off at the boundary of etching protection mask 9, forming an acute angle and thereby, forming cathode 17 at the edge of step 16.

Then as shown in FIG. 4(*e*), insulation layer 10 and 10' and gate electrodes 18 and 18' are successively deposited on the nearly entire surface of silicon single crystal substrate 1. At this time, etching protection mask 9 acts as a deposition mask. At the same time, a gate electrode 18 is formed on the base surface exactly at a position close to the cathode without applying any extra trimming process.

Finally, as shown in FIG. 4(*f*), etching protection mask 9, insulation layer 10' and gate electrode 18' formed on the elevated surface are altogether removed by applying a lift-off process to etching protection mask 9 exposing cathode 17.

This fabrication process has the distinct advantage of fabricating a field-emission element having excellent characteristics and good reproducibility.

Second Embodiment

A number of field-emission elements each having a linear cathode and the process of fabricating the elements have been described above as the first embodiment of the invention. Now there will be described a field-emission element, wherein both the cathode and the gate electrode have identical zigzag patterns.

Figure 5:
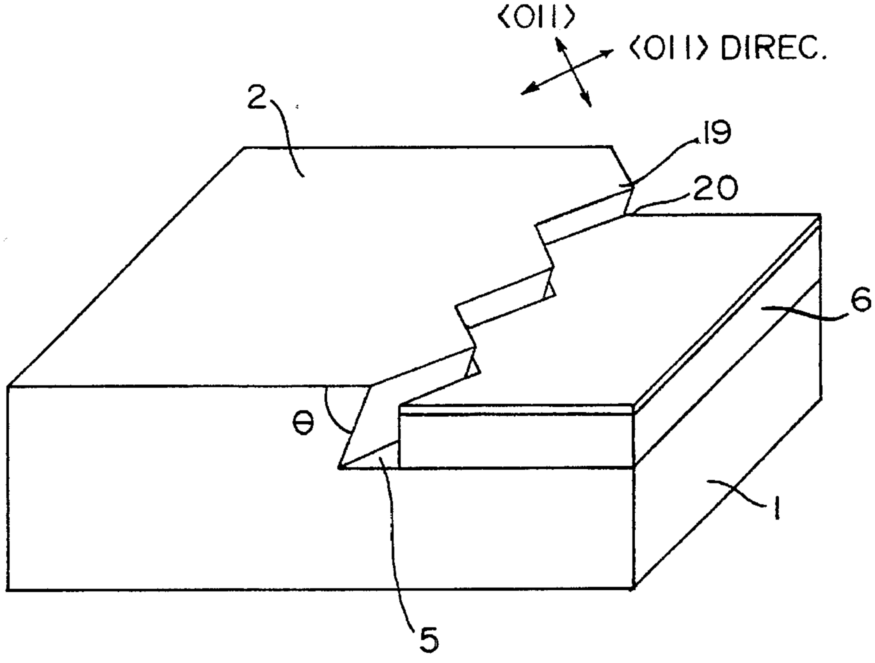
FIG. 5 is a perspective cross-sectional view of a field-emission element according to the second embodiment of the invention.

FIG. 5 shows a silicon single crystal substrate 1, an elevated surface 2 with a zigzag-shaped cathode 19 formed along the <011> direction of the silicon single crystal substrate 1, a zigzag-shaped gate electrode 20, insulated from base surface 5 by insulation layer 6, formed on the base surface 5. The gate electrode 20 is mutually and closely faced with the zigzag-shaped cathode 19 at a constant pitch widthwise. Each horizontally protruded part of the zigzag-shaped cathode 19 has a small radius curvature and as a result, electrons are emitted easily therefrom.

The element shown in FIG. 5 and described above has the distinct advantage of being operable at a substantially lower voltage than the element described under the first embodiment. It should be apparent that the element described in the second embodiment can be fabricated using the same fabrication process described under the first embodiment, thereby, providing an element with excellent characteristics and good reproducibility.

Third Embodiment

The cathode and the gate electrodes face each other mutually in the width direction in the first and second embodiments. However, field-emission elements having cathodes surrounded by a gate electrode are also possible and are explained below by referring to FIG. 6 and FIG. 7.

Figure 6:
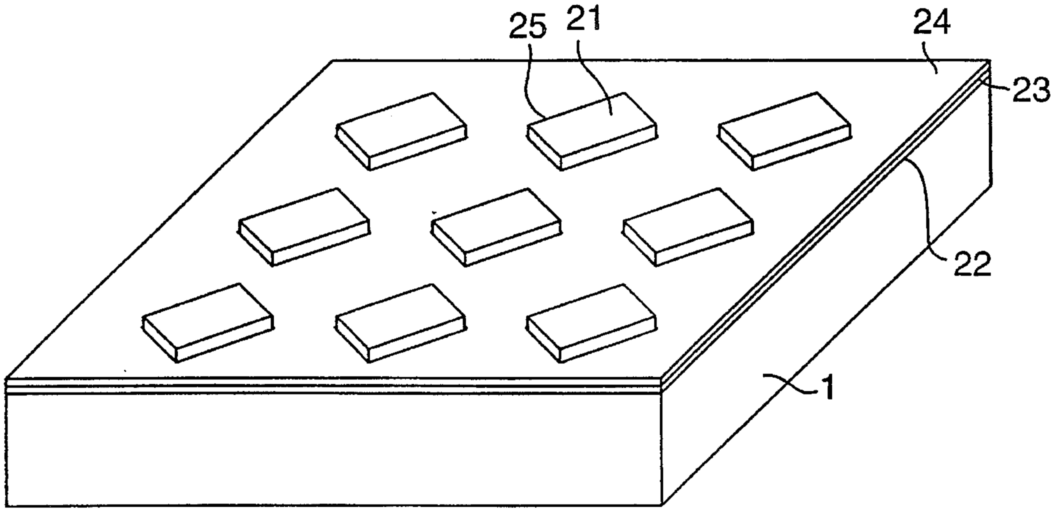
FIG. 6 is a perspective view of a field-emission element according to the third embodiment of the invention.

In FIG. 6, there is shown a field-emission element with plural rectangular or polygonal elevated surfaces 21 disposed on silicon single crystal substrate 1. Each of the rectangular elevated surfaces is surrounded by gate electrode 24 insulated from a base surface 22 by means of an insulation layer 23 and disposed on a base surface 22. With this field-emission element, electrons are emitted from cathodes 25 when a voltage is applied between the elevated surfaces 21 and the gate electrode 24.

Figure 7:
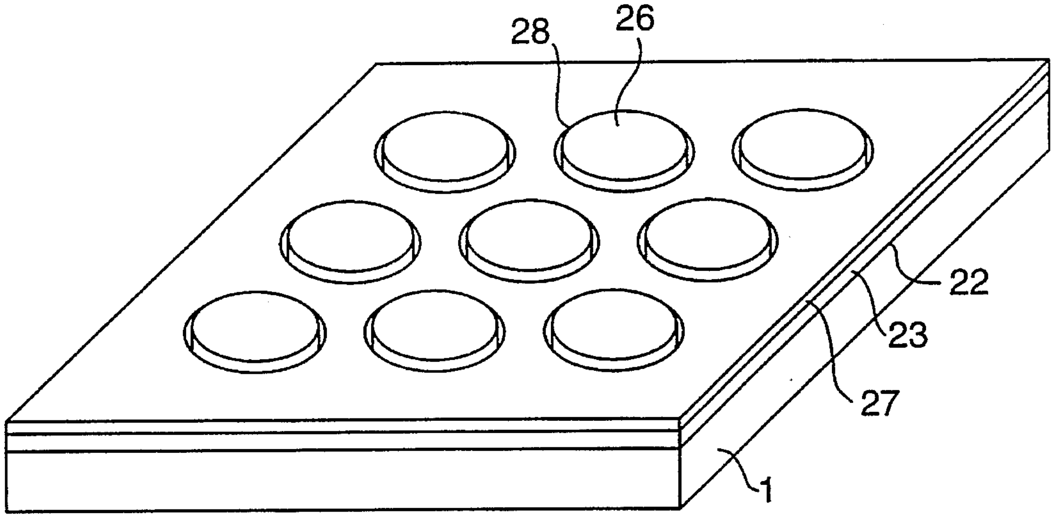
FIG. 7 is a perspective view of another field-emission element according to the third embodiment of the invention.

On the other hand, FIG. 7 shows a field-emission element provided with plural circular or nearly circular elevated surfaces 26 disposed on silicon single crystal substrate 1. Each of the circular elevated surfaces is surrounded by gate electrode 27 insulated from a base surface 22 by means of an insulation layer 23 and disposed on a base surface 22. Electrons are emitted from cathodes 28 when a voltage is applied between the elevated surface 26 and the gate electrode 27. The field-emission elements just described as the third embodiment, and shown in FIGS. 6 and 7, can be fabricated by using the fabrication process described under the first embodiment.

Fourth Embodiment

Figure 8:
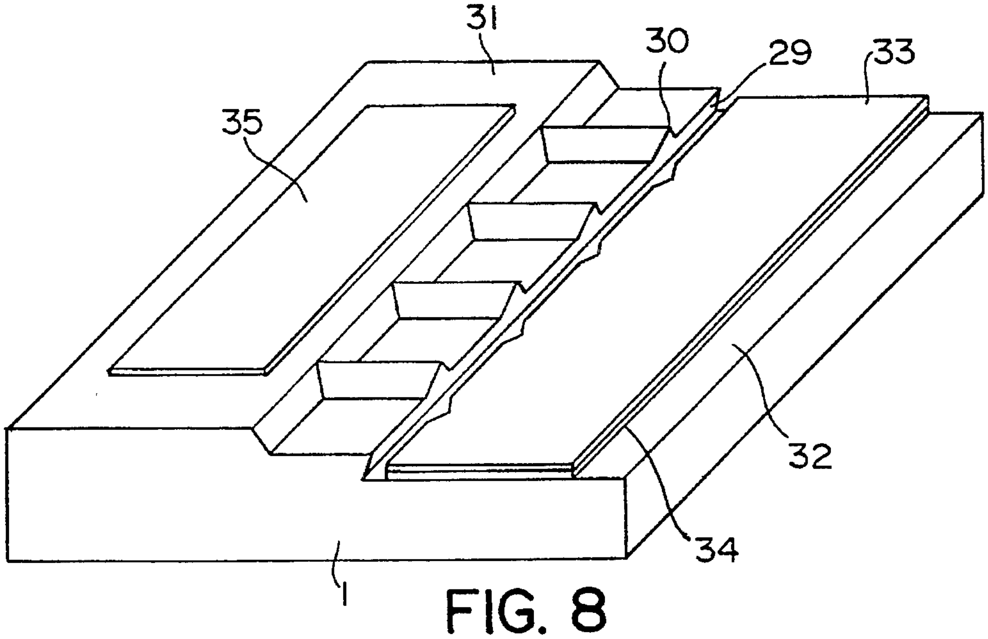
FIG. 8 is a perspective view of a field-emission element according to the fourth embodiment of the invention.
Figure 9A:
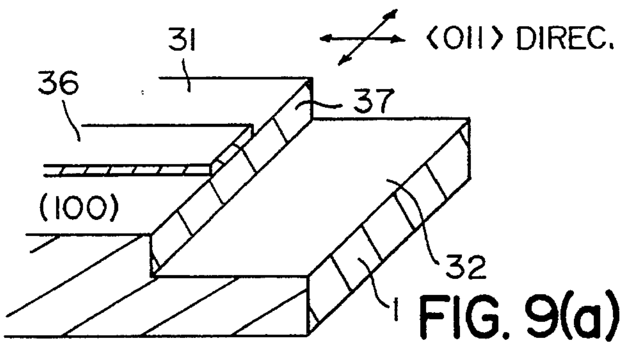
FIGS. 9(*a*) and 9(*b*) are perspective views and FIGS. 9(*c*), 9(*d*), and 9(*e*)-are cross-sectional views of a field-emission element according to the fourth embodiment of the invention, depicting its fabrication process.
Figure 9B:
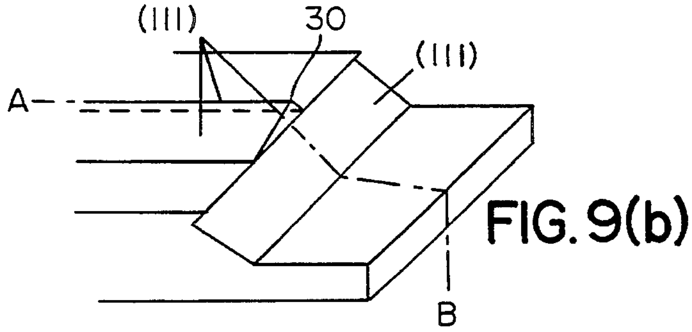
Figure 9C:
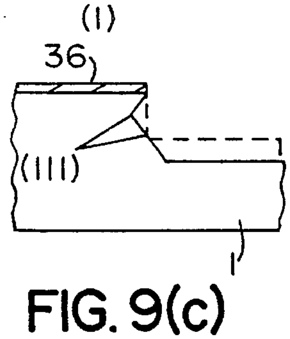
Figure 9D:
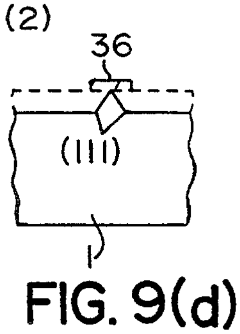
Figure 9E:
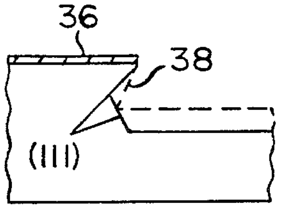

Another embodiment of the invention is explained next by turning to FIGS. 8 to 10(*f*"). FIG. 8 shows a perspective view of a field-emission element equipped with densely disposed triangular pyramid-shaped cathodes 30 with each cathode having a sharp apex. In FIG. 8, a step 29 and the cathodes 30 are formed along the <011> direction on the (100) plane of silicon single crystal substrate 1. The triangular pyramid-shaped cathodes 30 with the sharp apexes, protrude from the elevated surface 31 toward the base surface 32, and are formed by applying a wet anisotropic-etching process as described under the first embodiment. Gate electrode 33 is formed on the base surface 32 at a position close to cathodes 30 on a sandwiching insulation layer 34. The insulation layer 34 insulates the gate electrode 33 from the base surface 32. A terminal 35 is used to apply a voltage to cathodes 30.

With the field-emission element shown in FIG. 8, electrons are emitted from the pyramid-shaped cathodes 30 toward a direction vertical to step 29 and nearly parallel to silicon single crystal substrate 1 by applying a voltage between the cathodes 30 and the gate electrode 33. The details of the field-emission element shown in FIG. 8 is now explained below by turning to FIGS. 9(*a*) to 9(*e*).

FIG. 9(*a*) shows a silicon single crystal substrate 1 before a wet anisotropic-etching is applied thereto, and an etching protection mask 36 formed thereon. The silicon single crystal substrate 1 is separated into elevated surface 31 and base surface 32 by a step 37. The step 37 has its boundary along the <011> direction formed on the (100) plane of silicon single crystal substrate. A line-shaped etching protection mask 36 on the elevated surface 31 has a nearly constant width, an edge at the step 37, and is vertical to step 37.

FIG. 9(*b*) shows a surface of silicon single crystal substrate 1 after applying said anisotropic-etching, using an aqueous solution of potassium hydroxide thereon and removing the etching protection mask 36. The result is a sharp cathode 30 surrounded by the (111) planes.

FIGS. 9(*c*) and 9(*d*) show cross-sections of the silicon single crystal substrate shown in FIG. 9(*a*) before and after an anisotropic-etching is performed thereon. FIG. 9(*c*) is a longitudinal view and FIG. 9(*d*) is an end view. The portion of FIG. 9(*c*) and FIG. 9(*d*) identified by the broken lines represents the substrate 1 before applying the etching. The solid line in these two views identifies the substrate following the anisotropic-etching.

As shown by the cross-section depicted in FIG. 9(*d*), a line-shaped protrusion having a triangular pyramid-shaped cross-section and (111) plane is formed beneath line-shaped mask 36. As shown by the cross section depicted in FIG. 9(*c*), the (110) planes appear at the end of the step facing toward the inside of etching protection mask 36, forming an acute angle to the surface of silicon single crystal substrate 1 (an acute angle along the lateral direction). As a result, a sharp apex can be formed at the end of the cathode, and also, cathodes of precise construction protruding from elevated surfaces 31 to base surface 32 can be formed.

Moreover, a gate electrode can be precisely formed on base surface 32 by utilizing the protruded cathodes as a self-alignment mask.

Further, although the embodiment depicted in FIGS. 9(*c*) and 9(*d*) shows only an example where the step is formed in a near vertical direction to the surface of substrate, a flat base surface 32 can also be formed directly below the elevated surface by applying a dry-etching to silicon single crystal substrate 1 from an angle oblique to mask 36 to form a step having an acute angle to the elevated surface 31. As a result, the exactness of the gate electrode can be improved further by employing a slanted step construction. The cross-section along the line direction obtained in this case is shown in FIG. 9(*e*) wherein, the broken line shows the substrate before anisotropic-etching is performed, and the solid line shows the substrate after anisotropic-etching is performed. A slanted step 38 is formed by said oblique dry-etching.

This embodiment using cathodes made of steep triangular pyramids results in a field-emission element that has the significant advantage of being operable at a voltage still lower than the voltage that can be used to operate the element described in the second embodiment.

The details of the method for fabricating this element will now be explained below by turning to FIGS. 10(*a*) to 10(*f*") wherein the FIGS. identified as FIGS. 10(*a*)–10(*f*) show top views, the FIGS. identified as FIGS. 10(*a*') to 10(*f*') show cross-sections along a line direction of the substrate, and the FIGS. identified as FIGS. 10(*a*") to 10(*f*") show cross-sections of the substrate during the respective steps of the process.

The fabrication process is begun with a deposition of a silicon oxide layer and a succeeding photolithographic deposition of etching protection mask 36 having a boundary along the <011> direction on the surface of silicon single crystal substrate 1. Then, as shown in FIG. 10(*b*'), a step 38, intersecting with an elevated surface at an acute angle, is formed by applying a dry-etching process along the boundary of etching protection mask 36 from an oblique direction to the vertical direction to the surface of the silicon single crystal substrate 1.

Then, as shown in FIGS. 10(*c*) to 10(*c*"), the silicon oxide layer is etched off again by applying a photolithographic process in order to form an etching protection mask 39 in which a linear region having a constant width along the <011> direction vertical to step 38 is included.

Then, as shown in FIGS. 10(*d*') and 10(*d*"), a V-shaped step is formed by applying a wet anisotropic-etching using an aqueous solution of potassium hydroxide. Since the cathodes are formed within step 38 by etching, cathodes taking the form of a sharp triangular pyramid apex are produced. Then, as shown in FIGS. 10(*e*') and 10(*e*"), both the insulation layer 39 and the gate electrode 33 are deposited on nearly the entire surface. Etching protection mask 36 acts as a deposition mask in this case. However, at the same time, the mask 36 makes the deposition of gate electrode 33 at a position very close to the cathodes possible without requiring an extra trimming process.

Finally, as shown in FIGS. 10(*f*) to 10(*f*"), the fabrication process is completed by removing the etching protection mask 36 from the surface of the cathodes by applying a lift-off process.

Again, the fabrication process results in a field-emission element that has excellent characteristics and good reproducibility.

Fifth Embodiment

Figure 11:
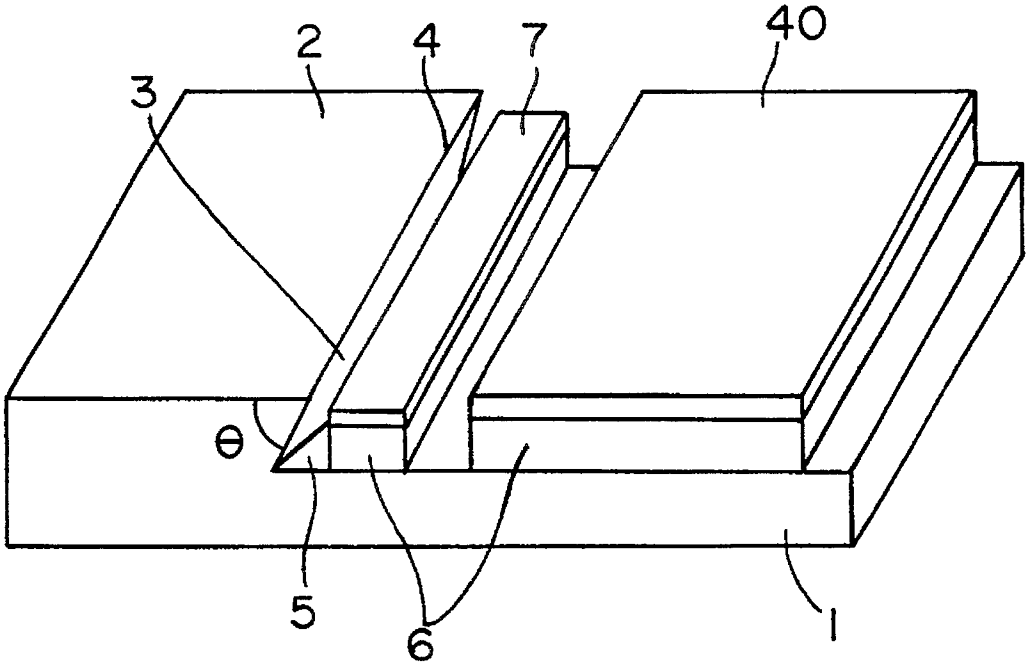
FIG. 11 is a perspective cross-sectional view of a field-emission element according to the fifth embodiment of the invention.
Figure 12A:
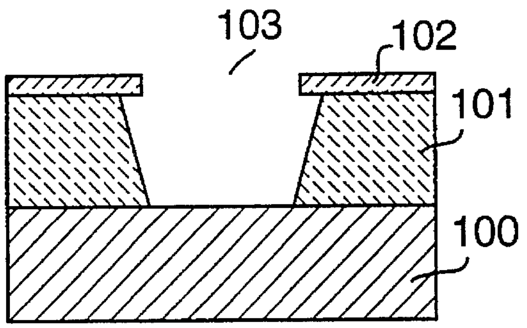
FIG. 12(a) PRIOR ART
FIG. 12 (*a*), 12(*b*), 12(*c*) and 12(*d*) are sectional views showing the steps in fabricating a conventional cone-shaped (vertical type) find-emission type cathode.
Figure 12B:
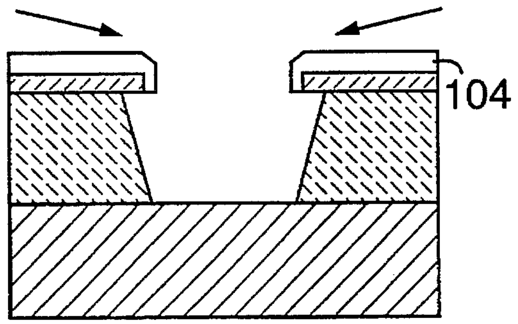
FIG. 12(b) PRIOR ART
Figure 12C:
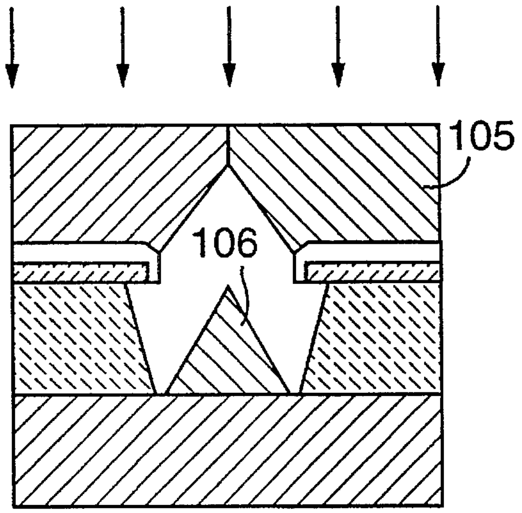
FIG. 12(c) PRIOR ART
Figure 12D:
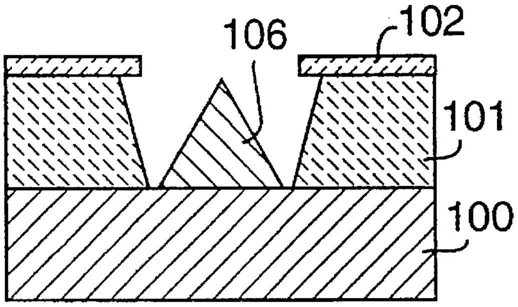
FIG. 12(d) PRIOR ART
Figure 13A:
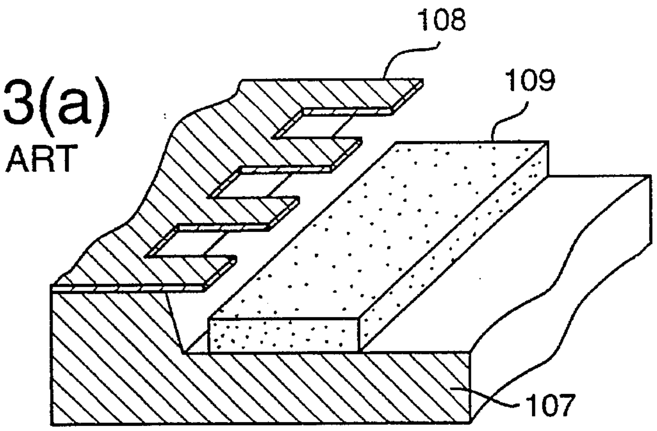
FIG.13(a) PRIOR ART
FIG. 13(*a*) is a perspective view and FIGS. 13(*b*), 13(*c*), 13(*d*), 13(*e*), 13(*f*), 13(*g*) and 13(*h*) are oblique cross-sectional views of a conventional planar (horizontal type) field-emission type cathode and the process used in fabricating the cathode.
Figure 13B:
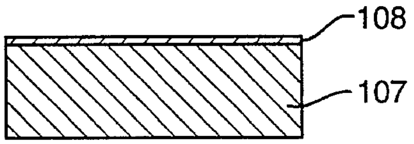
FIG.13(b) PRIOR ART
Figure 13C:
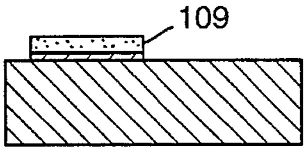
FIG.13(c) PRIOR ART
Figure 13D:
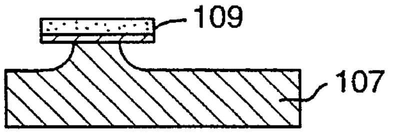
FIG.13(d) PRIOR ART
Figure 13E:
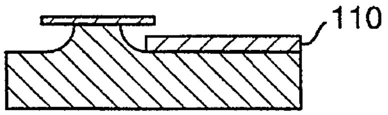
FIG.13(e) PRIOR ART
Figure 13F:
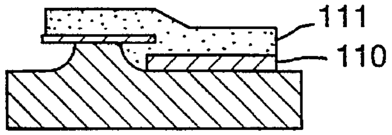
FIG.13(f) PRIOR ART
Figure 13G:
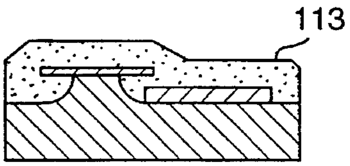
FIG.13(g) PRIOR ART
Figure 13H:
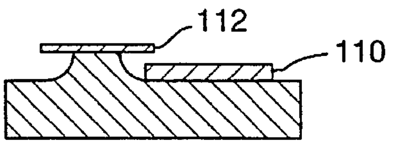
FIG.13(h) PRIOR ART

A fifth embodiment of the invention is now explained by referring to FIG. 11. The only difference is that an anode electrode 40, insulated from the base surface by insulating layer 6 is disposed on the base surface, at a side opposite the face of the gate electrode 7 facing the elevated surface 2. In this embodiment, the cathode 4, gate electrode 7, and anode electrode 40 can be disposed planarly.

Although the embodiments of the invention have been explained by using a silicon single crystal substrate, so far as the field-emission element is fabricated by dry-etching, the same effects can be obtained by using a conductive substrate made of metal such as molybdenum or tungsten. Furthermore, the same effects can also be obtained by using a semiconductor substrate such as gallium-arsenide substrate.

Moreover, by using an N-type silicon substrate and by forming a P-type cathode in advance thereon by ion-injection or thermal diffusion forming a PN junction beneath the cathode, a higher breakdown voltage between the gate electrode and the cathode can be obtained. In addition to the above, a steeper cathode can be formed by applying a thermal oxidation and by removing the oxide layer formed on the cathode after applying an anisotropic-etching process thereto. A functional device can also be formed by providing a control electrode on the other part of substrate surface. The field-emission element as described above can be integrated with other integrated circuits by forming an impurity doped region on the substrate.

Thus, a field-emission element having significant advantages provided by having a cathode with a minimum radius of curvature, minimum emitter-to-gate distances, and operable at much less than 150 volts. In addition, the fabrication steps disclosed herein permit the field-emission element to be fabricated using processes that result in high reproducibility, device uniformity and excellent characteristics.

The field-emission elements described above are highly advantageous for use in various electronic devices such as electron-beam excited lasers, solid-state flat devices, and micro-vacuum devices. The field emission elements are particularly useful as integrated field-emission elements operable at low voltages.

Of course, it should be understood that a wide range of changes and modifications can be made to the preferred embodiment described above. It is therefore intended that the foregoing detailed description be regarded as illustrative rather than limiting, and that it be understood that it is the following claims, including all equivalents, which are intended to define the scope of this invention.

What is claimed is:

1. A field-emission element comprising:

a substrate selected from a group consisting of a conductive substrate and a semiconductor substrate;

an elevated surface disposed on said substrate;

a step intersecting with said elevated surface making an acute angle;

a cathode formed at the intersection between said step and said elevated surface;

a base surface disposed on said substrate intersecting with a lower edge of said step;

an insulation layer disposed on said base surface; and a gate electrode insulated from said base surface, disposed on said insulation layer at a position close to said cathode due to the thickness of said insulation layer;

wherein electrons are emitted from said cathode when an electric field is applied between said gate electrode and said cathode.

2. A field-emission element comprising:

a substrate selected from a group consisting of a conductive substrate and a semiconductor substrate;

an elevated surface disposed on said substrate;

a step intersecting with said elevated surface making an acute angle;

a cathode formed at the intersection between said step and said elevated surface;

a base surface disposed on said substrate intersecting with a lower edge of said step;

an insulation layer disposed on said base surface;

a gate electrode insulated from said base surface disposed on said insulation layer, at a position close to said cathode due to the thickness of said insulation layer; and an anode electrode insulated from said base surface, disposed on said insulation layer and spaced from said gate electrode on a side opposite the side of said gate electrode closest to said cathode; wherein electrons are emitted from said cathode toward said anode electrode when an electric field is applied between said cathode and said gate electrode.

3. A field-emission element comprising:

a substrate selected from a group consisting of a conductive substrate and a semiconductor substrate;

elevated surfaces disposed on said substrate;

steps intersecting with said elevated surfaces making an acute angle;

cathodes formed at the intersection between each of said steps and each of said elevated surfaces;

a base surface disposed on said substrate intersecting with a lower edge of said steps;

an insulation layer disposed on said base surface; and a gate electrode insulated from said base surface, disposed on said insulation layer positioned to surround said cathodes due to the thickness of said insulation layer;

wherein electrons are emitted from said cathodes when an electric field is applied between said gate electrodes and said cathodes.

4. A field-emission element comprising:

a semiconductor substrate;

an elevated surface disposed on said semiconductor substrate;

a V-shaped step inwardly formed at the boundary between said semiconductor substrate and said elevated surface making an acute angle;

a cathode formed on an intersection between said V-shaped step and said elevated surface;

a base surface disposed on said semiconductor substrate intersecting with a lower edge of said V-shaped step;

an insulation layer disposed on said base surface; and a gate electrode insulated from said base surface, disposed on said insulation layer at a position close to said cathode due to the thickness of said insulation layer;

wherein electrons are emitted from said cathode when an electric field is applied between said gate electrode and said cathode.

5. A field-emission element comprising:

a semiconductor substrate;

an elevated surface disposed on said semiconductor substrate;

a step intersecting with said elevated surface making an acute angle;

a base surface disposed on said semiconductor substrate intersecting with a lower edge of said step;

a triangular line-shaped protrusion disposed on said elevated surface having an apex protruding from said elevated surface toward said base surface;

a triangular pyramid-shaped cathode formed at said apex;

an insulation layer disposed on said base surface; and a gate electrode insulated from said base surface, disposed on said insulation layer at a position close to said triangular pyramid shaped cathode due to the thickness of said insulation layer;

wherein electrons are emitted from said triangular pyramid shaped cathode when an electric field is applied between said gate electrode and said triangular pyramid shaped cathode.

6. A field-emission element according to claim 1, 2, 3, 4 or 5, wherein the radius of curvature of said cathode is less than 20 nm, and the distance between said cathode and said gate electrode is less than 1 micron.

7. A field-emission element according to claim 1 or 2, wherein both said cathode and said gate electrode take a linear shape, and face each other along the width direction at a constant interval.

8. A field-emission element according to claim 1 or 2, wherein both said cathode and said gate electrodes take an identical zigzag-shape, and face each other along the width direction at a constant interval.

9. A field-emission element according to claim 3, wherein the shape of said elevated surfaces is polygonal.

10. A field-emission element according to claim 3, wherein the shape of said elevated surfaces is nearly circular.

11. A field-emission element according to claim 1, 2 or 3, wherein the material of said conductive substrate is molybdenum.

12. A field-emission element according to claim 1, 2 or 3, wherein the material of said conductive substrate is tungsten.

13. A field-emission element according to claim 1, 2, 3, 4 or 5, wherein said semiconductor substrate is silicon.

14. A field-emission element according to claim 1, 2, 3, 4 or 5, wherein said semiconductor substrate is gallium arsenide.

15. A field-emission element according to claim 1, 2, 3, 4 or 5, wherein said elevated surface and said base surface of said semiconductor substrate are the (100) plane, and said step surface is the (111) plane.

16. A field-emission element according to claim 1, 2, 3, 4 or 5, wherein said elevated surface and said base surface of said semiconductor substrate are the (100) plane, and said step surface comprises the (331) plane.

* * * * *